(12) United States Patent
Shinohara

(10) Patent No.: US 11,746,903 B2
(45) Date of Patent: Sep. 5, 2023

(54) PISTON RING AND METHOD FOR MANUFACTURING SAME

(71) Applicant: KABUSHIKI KAISHA RIKEN, Tokyo (JP)

(72) Inventor: Akio Shinohara, Kashiwazaki (JP)

( * ) Notice: Subject to any disclaimer, the term of this patent is extended or adjusted under 35 U.S.C. 154(b) by 0 days.

(21) Appl. No.: 17/996,433

(22) PCT Filed: Dec. 8, 2021

(86) PCT No.: PCT/JP2021/045155
§ 371 (c)(1),
(2) Date: Oct. 18, 2022

(87) PCT Pub. No.: WO2022/209023
PCT Pub. Date: Oct. 6, 2022

(65) Prior Publication Data
US 2023/0127883 A1    Apr. 27, 2023

(30) Foreign Application Priority Data

Mar. 30, 2021 (JP) ................................. 2021-057342

(51) Int. Cl.
| | |
|---|---|
| *F16J 9/26* | (2006.01) |
| *C23C 14/06* | (2006.01) |
| *C23C 14/32* | (2006.01) |

(52) U.S. Cl.
CPC ............. *F16J 9/26* (2013.01); *C23C 14/0605* (2013.01); *C23C 14/325* (2013.01)

(58) Field of Classification Search
CPC ...... F16J 15/26; C23C 14/0605; C23C 14/325
See application file for complete search history.

(56) References Cited

U.S. PATENT DOCUMENTS

| | | | | |
|---|---|---|---|---|
| 3,806,139 A | * | 4/1974 | Suzuki | ...................... F16J 9/26 205/135 |
| 2007/0082129 A1 | | 4/2007 | Shimoda et al. | |

(Continued)

FOREIGN PATENT DOCUMENTS

| | | |
|---|---|---|
| CN | 104838183 | 8/2015 |
| CN | 104903630 | 9/2015 |

(Continued)

OTHER PUBLICATIONS

International Search Report dated Feb. 8, 2022 for PCT/JP2021/045155.

*Primary Examiner* — Gilbert Y Lee
(74) *Attorney, Agent, or Firm* — SOEI PATENT & LAW FIRM

(57) ABSTRACT

A method for manufacturing a piston ring includes the following steps:
(A) a step of supplying an arc current to a cathode formed of a carbon material having a density of 1.70 g/cm³ or more, to ionize the carbon material; and
(B) a step of applying a bias voltage in an environment where hydrogen atoms are substantially absent to form a DLC film on a surface of a base material for a piston ring.

The step (A) is continuously carried out, subsequently the step (A) is interrupted, and then the step (A) is restarted, which sequence is repeated thereby to form the DLC film having an extinction coefficient of 0.1 to 0.4 as measured using light having a wavelength of 550 nm and a nanoindentation hardness of 16 to 26 GPa.

18 Claims, 2 Drawing Sheets

(56) References Cited

U.S. PATENT DOCUMENTS

| | | | |
|---|---|---|---|
| 2015/0300493 | A1 | 10/2015 | Kunimoto et al. |
| 2015/0330507 | A1 | 11/2015 | Kamura et al. |
| 2018/0180181 | A1 | 6/2018 | Ozaki et al. |
| 2020/0217416 | A1 | 7/2020 | Okazaki et al. |

FOREIGN PATENT DOCUMENTS

| | | | |
|---|---|---|---|
| CN | 107614944 | | 1/2018 |
| EP | 3816486 | | 5/2021 |
| JP | 2002-285328 | | 10/2002 |
| JP | 2008297171 A | * 12/2008 | ............ B29C 33/56 |
| JP | 2014-062326 | | 4/2014 |
| JP | 2020132466 A | * 8/2020 | |
| JP | 2020-200803 | | 12/2020 |
| WO | 2014/091831 | | 6/2014 |
| WO | 2014/103940 | | 7/2014 |
| WO | 2016/021671 | | 2/2016 |
| WO | 2017/022660 | | 2/2017 |

* cited by examiner

PISTON RING AND METHOD FOR MANUFACTURING SAME

CROSS-REFERENCE TO RELATED APPLICATIONS

This application is a 35 U.S.C. § 371 national phase application of PCT/JP2021/045155, filed on Dec. 8, 2021, which claims priority to Japanese Patent Application No. 2021-057342, filed on Mar. 30, 2021.

TECHNICAL FIELD

The present disclosure relates to a piston ring and a method for manufacturing the same.

BACKGROUND ART

Fuel efficiency of automobile engines needs to be improved. For example, in order to reduce friction loss, piston rings having a sliding surface coated with a diamond like carbon film (a DLC film) having a low coefficient of friction are applied to some engines. The DLC film is comprised of a mixture of carbon bonds including diamond bonds ($sp^3$ bonds) and graphite bonds ($sp^2$ bonds). The DLC film is suitable as a coating film for sliding members because it has hardness, wear resistance, and chemical stability similar to those of a diamond and also has solid lubricity and a low coefficient of friction similar to those of a graphite.

Patent Literature 1 discloses an invention relating to a DLC film and a DLC film-coated article. The invention described in this literature is intended to improve heat resistance of the DLC film formed on an object and to provide a hydrogen-free and high-hardness DLC film.

CITATION LIST

Patent Literature

[Patent Literature 1] International Publication No.

SUMMARY OF INVENTION

Technical Problem

The present inventors examined whether or not the DLC film described in Patent Literature 1 can be applied to a coating film of a piston ring. As a result, the present inventors came to the conclusion that although the DLC film described in this literature is favorable with respect to its excellent heat resistance, it would find a difficulty to be applied as is to a coating film of a piston ring because the thickness thereof is too thin and the hardness thereof is too high. Table 7 of Patent Literature 1 describes that a DLC film having a thickness in the range of 101 to 449 nm is formed. On the other hand, a thickness of a coating film of a piston ring is preferably about 5 to 20 μm. Further, the DLC film described in Patent Literature 1 has a "ta-C structure." As described in paragraph [0020] of Patent Literature 1, the DLC film having this structure has a high nanoindentation hardness of 40 to 100 GPa, but it is easily chipped and has insufficient adhesion to a base material, which presents a problem.

The present disclosure provides a piston ring furnished with a DLC film having excellent heat resistance and, at the same time, having excellent adhesion to a base material, as well as a method for manufacturing the same.

Solution to Problem

The method for manufacturing a piston ring according to the present disclosure includes the following steps:
(A) a step of supplying an arc current to a cathode formed of a carbon material having a density of 1.70 $g/cm^3$ or more, to ionize the carbon material; and
(B) a step of applying a bias voltage in an environment where hydrogen atoms are substantially absent to form a DLC film on a surface of a base material for a piston ring.

In the manufacturing method according to the present disclosure, the step (A) is carried out continuously, subsequently the step (A) is interrupted, and then the step (A) is restarted, which sequence is repeated thereby to form the DLC film having an extinction coefficient of 0.1 to 0.4 measured using light having a wavelength of 550 nm and a nanoindentation hardness of 16 to 26 GPa.

According to the above manufacturing method, a carbon material having a density of 1.70 $g/cm^3$ or more is used as a material of a cathode, while the step (A) is periodically interrupted to periodically lower the temperature of the cathode. Thus, it is possible to form the DLC film having excellent heat resistance and excellent adhesion to the base material. The term "extinction coefficient" refers to a physical property that reflects the amount of fine defects present in the DLC film, and a small extinction coefficient means that there are few defects. The DLC film with few fine defects has excellent heat resistance (oxidation resistance at a high temperature). The term "nanoindentation hardness" refers to a physical property that affects the adhesion of the DLC film to the base material. When the nanoindentation hardness is too large, there is a tendency that cracks are likely to occur due to insufficient toughness, and the DLC film is likely to peel off from the base material.

In the above manufacturing method, as the film formation of the DLC film progresses, the arc current may be set to decrease continuously or stepwise. When the DLC film is formed in this way, defects near the surface of the DLC film can be further reduced and heat resistance can be further improved.

A piston ring according to the present disclosure includes: a base material; and a DLC film provided to cover at least a part of a surface of the base material, wherein the DLC film has a hydrogen content of less than 5 atom %, an extinction coefficient of 0.1 to 0.4 as measured using light having a wavelength of 550 nm, and a nanoindentation hardness of 16 to 26 GPa. The DLC film has excellent heat resistance and, at the same time, excellent adhesion to a base material. A thickness of the DLC film is, for example, 3 to 20 μm. An ID/IG intensity ratio of the DLC film is preferably 0.4 or more. When the ID/IG intensity ratio is 0.4 or more, there is a tendency that chipping due to an excessive amount of an $sp^3$ component in the DLC film can be suppressed. The term "ID/IG intensity ratio" as used herein means an intensity ratio of a peak integrated intensity (ID) of a D band observed in the range of 1260 to 1460 $cm^{-1}$ and a peak integrated intensity (IG) of a G band observed in the range of 1480 to 1680 $cm^{-1}$ of a Raman spectrum measured with a Raman spectroscope using an argon ion laser.

Since the DLC film according to the present disclosure has excellent heat resistance, heat treatment (for example, plating treatment) under the condition of an upper limit of 350° C. can be performed after forming the DLC film on the base material. For example, the piston ring according to the present disclosure may include: an outer peripheral surface formed of the DLC film; a side surface formed of a plated layer; and an inner peripheral surface formed of a plated layer. As a result, the wear resistance of regions other than the outer peripheral surface of the piston ring can be improved at a low cost.

Advantageous Effects of Invention

According to the present disclosure, there are provided a piston ring furnished with a DLC film having excellent heat resistance and, at the same time, having excellent adhesion to a base material as well as a method for manufacturing the same.

DESCRIPTION OF EMBODIMENTS

Hereinafter, embodiments of the present disclosure will be described with reference to the drawings. The present invention is not limited to the embodiments described below.

<Piston Ring>

Figure 1:
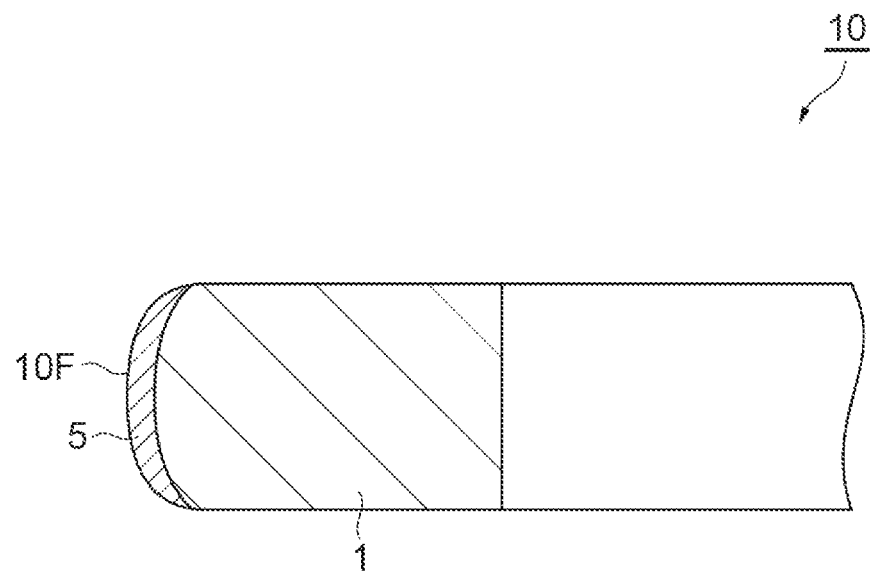
FIG. 1 is a cross-sectional view schematically showing an embodiment of a piston ring according to the present disclosure.

FIG. 1 is a cross-sectional view schematically showing a piston ring according to the present embodiment. The piston ring 10 shown in FIG. 1 is a compression ring for an internal combustion engine (for example, an automobile engine). The compression ring is mounted, for example, in a ring groove formed on a side surface of a piston. The compression ring is a ring that is exposed to an environment with a high heat load of the engine. The piston ring according to the present embodiment is not limited to the compression ring and can also be applied as an oil ring.

The piston ring 10 has an annular shape and has, for example, an outer diameter of 40 to 300 mm. The term "annular shape" as used herein does not necessarily mean a closed circle, and the piston ring 10 may have a joint portion. Further, the piston ring 10 may have a perfect circular shape or an elliptical shape in a plan view. The piston ring 10 has a substantially rectangular shape in a cross section shown in FIG. 1, and a sliding surface 10F may be rounded to bulge outward.

The piston ring 10 includes a base material 1 and a DLC film 5 provided on an outer peripheral surface (a surface corresponding to the sliding surface 10F) of the base material 1. The base material 1 is made of a heat-resistant alloy. Specific examples of the alloy include a spring steel, a martensitic stainless steel, and the like. The base material 1 may have a nitrided layer formed on its surface. The piston ring 10 may have a configuration in which an intermediate layer (not shown) is formed between the base material 1 and the DLC film 5. The intermediate layer is formed of, for example, a material containing one or more elements selected from the group consisting of Cr, Ti, Co, V, Mo, Si, and W. The material of the intermediate layer may be a carbide, a nitride, or a carbonitride of the above elements. The thickness of the intermediate layer is, for example, 0.1 to 20 μm.

The DLC film 5 forms the sliding surface 10F. The DLC film 5 may have a hydrogen content of less than 5 atom %, preferably less than 2 atom %, and more preferably less than 1 atom % and may not substantially contain hydrogen. When the hydrogen content of the DLC film 5 is less than 5 atom %, the dangling bond of the surface carbon atom of the DLC film 5 is not terminated with hydrogen. Thus, it is confirmed that an oil-based agent constituent molecule having an OH group in a lubricating oil is easily adsorbed on the surface of the DLC film 5 and, therefore, that the film exhibits an extremely low coefficient of friction. The hydrogen content of the DLC film 5 can be measured by Rutherford backscattering spectrometry (RBS) or hydrogen forward scattering (HFS).

The DLC film 5 has an extinction coefficient of 0.1 to 0.4 as measured using light having a wavelength of 550 nm. A DLC film having an extinction coefficient of 0.4 or less tends to have few defects and to have excellent heat resistance. A DLC film having an extinction coefficient of less than 0.1 may be difficult to manufacture and may have poor adhesion. The extinction coefficient is preferably 0.1 to 0.3, and more preferably 0.1 to 0.2. The DLC film 5 has a nanoindentation hardness of 16 to 26 GPa. When the nanoindentation hardness is 16 GPa or more, the DLC film 5 tends to have excellent wear resistance. On the other hand, when the nanoindentation hardness is 26 GPa or less, the DLC film 5 tends to have excellent adhesion to the base material 1 and the intermediate layer. The nanoindentation hardness is preferably 18 to 24 GPa, and more preferably 20 to 23 GPa. When the nanoindentation hardness is in the above range, the DLC film 5 can be formed relatively thick and chipping due to stress can be suppressed.

The thickness of the DLC film 5 is, for example, in the range of 3 to 20 μm. When the thickness of the DLC film 5 is 3 μm or more, the DLC film 5 does not wear easily. On the other hand, when the thickness of the DLC film 5 is 20 μm or less, it is possible to prevent the internal stress in the film from becoming excessively large and it is easy to suppress the occurrence of chipping and peeling. From the viewpoints of productivity and durability of the piston ring 10, the thickness of the DLC film 5 is preferably 5 to 15 μm, and more preferably 5 to 12 μm.

The $sp^2$ ratio of the DLC film 5 is, for example, 0.5 to 0.8. When the $sp^2$ ratio of the DLC film 5 is 0.5 or more, the flexibility of the film tends to be improved and the adhesion tends to be improved. On the hand, when the $sp^2$ ratio exceeds 0.8, the strength of the film tends to be lowered and the heat resistance of the film tends to decrease. The $sp^2$ ratio is preferably 0.6 to 0.7. The term "$sp^2$ ratio" as used herein indicates a ratio of $sp^2$ bonds to $sp^2$ bonds and $sp^3$ bonds in the DLC film ($sp^2/(sp^2+sp^3)$) and means a value calculated on the basis of a spectrum obtained by electron energy loss spectroscopy (EELS).

The ID/IG intensity ratio of the DLC film 5 is preferably 0.4 or more, and more preferably 0.6 to 1.3. When the ID/IG intensity ratio is 0.4 or more, there is a tendency that chipping due to an excessive amount of the $sp^3$ component in the DLC film 5 can be suppressed.

From the viewpoint of heat resistance, the DLC film 5 preferably has few linear defects (portions having a locally low density) that extends to its surface. The DLC film 5 having few defects can be formed, for example, by adopting one or a combination of two or more of the following techniques.

A filtered cathode vacuum arc (FCVA) type device is used to reduce core droplets of the above defects.

The temperature of a cathode is periodically lowered by periodically stopping an arc current of the FCVA type. As the film formation of the DLC film 5 progresses, an arc current is set to decrease continuously or stepwise. A carbon material with a density equal to or higher than a predetermined value is used for a cathode.

<Method for Manufacturing a Piston Ring>

A method for manufacturing a piston ring using an FCVA type device will be described. The manufacturing method according to the present embodiment includes the following steps:

(A) a step of supplying an arc current to a cathode formed of a carbon material having a density of 1.70 g/cm$^3$ or more, to ionize the carbon material; and (B) a step of applying a bias voltage in an environment where hydrogen atoms are substantially absent to form the DLC film on the surface of the base material 1.

The step (A) is continuously carried out for 20 to 60 minutes, subsequently the step (A) is interrupted for 1 to 10 minutes, and then the step (A) is restarted, which sequence is repeated thereby to form the DLC film 5 having an extinction coefficient of 0.1 to 0.4 as measured using light having a wavelength of 550 nm and a nanoindentation hardness of 16 to 26 GPa. The number of times that the step (A) is repeatedly carried out and interrupted may be determined according to the thickness of the DLC film 5.

According to the above manufacturing method, a carbon material having a density of 1.70 g/cm$^3$ or more is used as a material of a cathode, while the step (A) is periodically interrupted to periodically lower the temperature of the cathode. Thus, it is possible to form the DLC film 5 having excellent heat resistance and excellent adhesion to the base material 1.

[Step (A)]

In this step, the carbon material is ionized by supplying an arc current to the cathode formed of the carbon material. The density of the carbon material is 1.70 g/cm$^3$ or more, preferably 1.76 g/cm$^3$ or more, and more preferably 1.80 to 1.95 g/cm$^3$. When the density is 1.76 g/cm$^3$ or more, the number of defects in the DLC film 5 can be sufficiently reduced, and the DLC film 5 having excellent heat resistance can be formed. When the density is 1.76 g/cm$^3$ or more, and especially 1.80 g/cm$^3$ or more, droplets released from the cathode at the time of discharge tend to be reduced, and droplet incorporation into the DLC film, that is, defects in the DLC film tend to be reduced.

As described above, the step (A) is carried out continuously for 20 to 60 minutes, subsequently the step (A) is interrupted for 1 to 10 minutes, and then the step (A) is restarted, which is repeated thereby to form the DLC film 5 having a predetermined thickness. At this time, as the film formation of the DLC film 5 progresses, the arc current may be set to decrease continuously or stepwise in the step (A) as described above.

In a case where the arc current is inclined to decrease continuously or stepwise in the step (A), an arc current value A1 at the time that the step (A) is started or restarted is preferably 100 to 200 A. Preferably, an arc current value A2 at the time that the step (A) is interrupted or ended is decreased in the range of 20 to 100 A relative to the arc current value A1. By decreasing the arc current value A1 to the arc current value A2 in this range, defects in the DLC film 5 can be further reduced, and the DLC film 5 having even better heat resistance can be obtained.

[Step (B)]

In this step, a bias voltage is applied in an environment where hydrogen atoms are substantially absent to form the DLC film on the surface of the base material 1. In the step (B), the bias voltage is applied in a pulse shape at 1000 to 2500 V, for example. In the step (B), when the bias voltage is applied in a pulse shape at 1800 V or higher, the DLC film 5 having an appropriate hardness tends to be stably formed.

Although the embodiment of the present disclosure has been described in detail above, the present invention is not limited to the above embodiment. For example, in the above embodiment, the case where the DLC film 5 is formed using the FCVA type device is illustrated, but the DLC film 5 may be formed using a vacuum arc (VA) type device.

Figure 2:
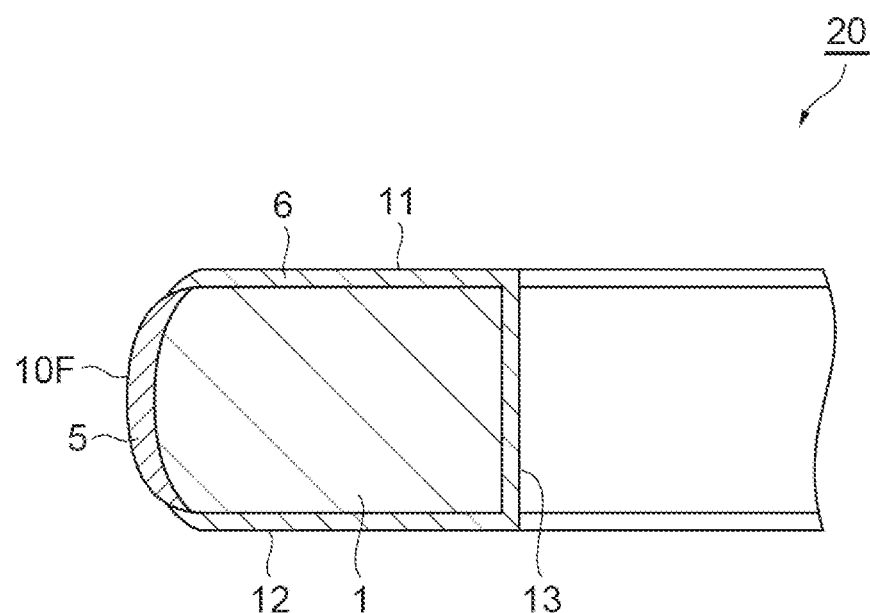
FIG. 2 is a cross-sectional view schematically showing another embodiment of a piston ring according to the present disclosure.

In the above embodiment, the case where the piston ring 10 is obtained through the step (B) is illustrated, but after the step (B), treatment in which a temperature of 250 to 350° C. is applied to the piston ring 10 (for example, a plating treatment such as a Ni plating treatment or Cr plating treatment) may be carried out. Since the DLC film 5 has excellent heat resistance, it is possible to prevent the performance of the DLC film 5 from deteriorating even if such a treatment is carried out. For example, the surface of the piston ring 10 obtained through the step (B) (excluding the surface of the DLC film 5) may be nickel-plated. A piston ring 20 shown in FIG. 2 is provided with a sliding surface 10F (an outer peripheral surface) formed of a DLC film 5, side surfaces 11 and 12 formed of a nickel-plated layer 6, and an inner peripheral surface 13 formed of the nickel-plated layer 6. By providing the nickel-plated layer 6, the wear resistance of regions other than the outer peripheral surface of the piston ring 20 can be improved at a low cost.

EXAMPLE

Hereinafter, examples and comparative examples of the present disclosure will be described. The present invention is not limited to the following examples.

Example 1

A piston ring was manufactured using a filtered cathode vacuum arc (FCVA) type device as described below. First, a pre-cleaned base material (an SUP10 equivalent material) was set in a jig. An arc ion plating device equipped with a graphite cathode as an evaporation source was prepared. After the jig was attached to a rotation axis of a rotation table of this device, the inside of a chamber of the device was set to a vacuum atmosphere of $1\times10^{-3}$ Pa or less. Ar gas was introduced into the chamber, and a bias voltage was applied to the base material to clean the surface of the base material by glow discharge. Then, the evaporation source of the graphite cathode was discharged to generate carbon ions. At the time of discharge, neutral particles called droplets are released in addition to carbon ions. Thus, through a magnetic filter for removing the neutral particles, only carbon ions were transported to the base material, and a DLC film was formed on the surface of the base material. In this way, the piston ring according to the example was obtained. Even in the FCVA type device, that is, a device provided with the above-mentioned magnetic filter, some droplet particles released from the cathode are reflected in the magnetic filter and reach the base material. Therefore, a cathode having a cathode density of 1.70 g/cm$^3$ or more was used, and the amount of the droplets released from the cathode was suppressed by periodically interrupting the step (A). As a result, it was possible to form a DLC coating film having few defects. Table 1 shows the film forming conditions of the present example.

Examples 2 and 3 and Comparative Examples 1 to 4

Piston rings according to Examples 2 and 3 and Comparative Examples 1 to 4 were obtained in the same manner as in Example 1, except that the DLC films were formed under the film forming conditions shown in Table 1 or Table 2.

Comparative Example 5

A piston ring was manufactured using a vacuum arc (VA) type device as described below. First, a pre-cleaned base material (an SUP10 equivalent material) was set in a jig. An arc ion plating device equipped with a graphite cathode as an evaporation source was prepared. After the jig was attached to a rotation axis of a rotation table of this device, the inside of a chamber of the device was set to a vacuum atmosphere of $1 \times 10^{-3}$ Pa or less. Ar gas was introduced into the chamber, and a bias voltage was applied to the base material to clean the surface of the base material by glow discharge. Then, the evaporation source of the graphite cathode was discharged to form a DLC film on the surface of the base material, and a piston ring according to Comparative Example 5 was obtained. Table 2 shows the film forming conditions of the present comparative example.

[Measurement]

The following characteristics of the piston rings according to the examples and the comparative examples were measured. The results are shown in Tables 1 and 2.

(1) Thickness of DLC Film

The piston ring was cut and the thickness of the DLC film was measured by observing the cross section.

(2) Hardness of DLC Film (Nanoindentation Hardness)

The hardness of the DLC film was measured by a nanoindentation method with a test load of 50 mN using a test device (manufactured by Elionix Inc., model number: ENT-1100a).

(3) ID/IG Intensity Ratio of DLC Film

The ID/IG intensity ratio of the DLC film was measured using a Raman spectrophotometer (manufactured by Renishaw plc., model number: inViaReflex, laser: 532 nm).

(4) Extinction Coefficient of DLC Film

The extinction coefficient of the DLC film at a light wavelength of 550 nm was measured with a measuring device (manufactured by HORIBA Ltd., model number: AutoSE, incident angle—69.95 degrees, measurement time—15 seconds, viewing area—250 μm×250 μm).

[Evaluation]

The following items of the piston rings according to the examples and the comparative examples were evaluated.

(1) Heat Resistance of DLC Film (Hardness Reduction Rate)

The above-mentioned nanoindentation hardness (the initial hardness) and the nanoindentation hardness after heat treatment (the hardness after heat treatment) were measured. The heat treatment conditions were as follows:

Heating furnace: atmospheric furnace;
Temperature: 300° C.; and
Heating time: 100 hours.

The hardness reduction rate was calculated from the formula described below. In a case where the hardness reduction rate was 5% or less, it was determined that the DLC film had excellent heat resistance.

(Hardness reduction rate)=[(Initial hardness)−(Hardness after heat treatment)]/(Initial hardness)×100

(2) Adhesion of DLC Film to Base Material

In an adhesion evaluation test where indentations were formed on the surface of the DLC coating film using a Rockwell C scale indenter under the condition of a load of 150 kgf, the adhesion was evaluated based on the peeling state of the vicinities of the indentations.

A: no peeling
B: slight peeling
C: large-scale peeling

TABLE 1

| | | Example 1 | Example 2 | Example 3 | Comparative Example 1 |
|---|---|---|---|---|---|
| Film forming conditions | Type | FCVA | FCVA | FCVA | FCVA |
| | Cathode density [g/cm³] | 1.85 | 1.80 | 1.95 | 1.85 |
| | Inclination of arc current A1 to A2 | Present | Absent | Present | Present |
| | Arc current A1 to A2 [A] | 150 to 100 | 150 | 150 to 100 | 150 to 100 |
| | Pulse bias voltage [V] | 1800 | 2000 | 1000 | 1800 |
| | (A) step continuation time [minutes] | 40 | 60 | 20 | 90 |
| | (A) step interruption time [minutes] | 3 | 3 | 5 | 2 |
| DLC film properties | Thickness [μm] | 10 | 20 | 9 | 9 |
| | Hardness [GPa] | 20 | 16 | 26 | 21 |
| | ID/IG intensity ratio | 0.7 | 0.8 | 0.4 | 0.7 |
| | Extinction coefficient | 0.18 | 0.40 | 0.12 | 0.45 |
| Evaluation | Hardness reduction rate | 1% | 5% | 2% | 14% |
| | Adhesion | A | A | A | A |

TABLE 2

| | | Comparative Example 2 | Comparative Example 3 | Comparative Example 4 | Comparative Example 5 |
|---|---|---|---|---|---|
| Film forming conditions | Type | FCVA | FCVA | FCVA | VA |
| | Cathode density [g/cm³] | 1.69 | 1.91 | 1.89 | 1.89 |
| | Inclination of arc current A1 to A2 | Absent | Absent | Absent | Absent |
| | Arc current A1 to A2 [A] | 150 | 150 | 150 | 60 |
| | Pulse bias voltage [V] | 1800 | 800 | 500 | 0 |
| | (A) step continuation time [minutes] | 40 | 40 | 40 | 30 |
| | (A) step interruption time [minutes] | 3 | 3 | 3 | 1 |

TABLE 2-continued

| | | Comparative Example 2 | Comparative Example 3 | Comparative Example 4 | Comparative Example 5 |
|---|---|---|---|---|---|
| DLC film properties | Thickness [μm] | 9 | 21 | 22 | 10 |
| | Hardness [GPa] | 20 | 27 | 29 | 13 |
| | ID/IG intensity ratio | 1.0 | 0.5 | 0.3 | 1.2 |
| | Extinction coefficient | 0.52 | 0.34 | 0.32 | 0.67 |
| Evaluation | Hardness reduction rate | 21% | 4% | 4% | 48% |
| | Adhesion | A | B | C | A |

INDUSTRIAL APPLICABILITY

According to the present disclosure, there is provided a method for manufacturing a piston ring provided with a DLC film having excellent heat resistance and, at the same time, excellent adhesion to a base material.

REFERENCE SIGNS LIST

1 Base material
5 DLC film
6 Nickel-plated layer
10, 20 Piston ring
10F Sliding surface
11, 12 Side surface
13 Inner peripheral surface

The invention claimed is:

1. A piston ring comprising:
a base material; and
a DLC film provided to cover at least a part of a surface of the base material,
wherein the DLC film has a hydrogen content of less than 5 atom %, an extinction coefficient of 0.1 to 0.4 as measured using light having a wavelength of 550 nm, and a nanoindentation hardness of 16 to 26 GPa.

2. The piston ring according to claim 1, wherein the DLC film has a thickness of 3 to 20 μm.

3. The piston ring according to claim 1, wherein the DLC film has an ID/IG intensity ratio of 0.4 or more.

4. The piston ring according to claim 1, further comprising:
an outer peripheral surface formed of the DLC film;
a side surface formed of a plated layer; and
an inner peripheral surface formed of a plated layer.

5. The piston ring according to claim 1, wherein the hydrogen content of the DLC film is less than 2 atom %.

6. The piston ring according to claim 1, wherein the hydrogen content of the DLC film is less than 1 atom %.

7. The piston ring according to claim 1, wherein the extinction coefficient of the DLC film is 0.1 to 0.3 as measured using light having a wavelength of 550 nm.

8. The piston ring according to claim 1, wherein the extinction coefficient of the DLC film is 0.1 to 0.2 as measured using light having a wavelength of 550 nm.

9. The piston ring according to claim 1, wherein the nanoindentation hardness of the DLC film is 18 to 24 GPa.

10. The piston ring according to claim 1, wherein the nanoindentation hardness of the DLC film is 20 to 23 GPa.

11. The piston ring according to claim 1, wherein the DLC film has a thickness of 5 to 15 μm.

12. The piston ring according to claim 1, wherein the DLC film has a thickness of 5 to 12 μm.

13. The piston ring according to claim 1, wherein a ratio of $sp^2$ bonds to a sum of $sp^2$ bonds and $sp^3$ bonds in the DLC film is 0.5 to 0.8.

14. The piston ring according to claim 1, wherein a ratio of $sp^2$ bonds to a sum of $sp^2$ bonds and $sp^3$ bonds in the DLC film is 0.6 to 0.7.

15. The piston ring according to claim 1, wherein the DLC film has an ID/IG intensity ratio of 0.6 to 1.3.

16. The piston ring according to claim 1, wherein the DLC film has a reduction rate in nanoindentation hardness of 5% or less as measured after heat treatment at 300° C. for 100 hours, wherein the reduction rate is determined by the equation of [(Initial nanoindentation hardness)−(Nanoindentation hardness after heat treatment)]/(Initial nanoindentation hardness)×100.

17. A method for manufacturing the piston ring according to claim 1, comprising:
(A) a step of supplying an arc current to a cathode formed of a carbon material having a density of 1.70 g/cm³ or more, to ionize the carbon material; and
(B) a step of applying a bias voltage in an environment in which hydrogen atoms are substantially absent to form the DLC film on the surface of the base material for the piston ring,
wherein the step (A) is continuously carried out, subsequently the step (A) is interrupted, and then the step (A) is restarted, which sequence is repeated thereby to form the DLC film.

18. The method for manufacturing a piston ring according to claim 17, wherein as film formation of the DLC film progresses, the arc current is set to decrease continuously or stepwise in the step (A).

* * * * *